United States Patent
Cheng et al.

(10) Patent No.: US 10,396,169 B2
(45) Date of Patent: Aug. 27, 2019

(54) NANOSHEET TRANSISTORS HAVING DIFFERENT GATE DIELECTRIC THICKNESSES ON THE SAME CHIP

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/846,461

(22) Filed: Dec. 19, 2017

(65) Prior Publication Data

US 2018/0197785 A1   Jul. 12, 2018

Related U.S. Application Data

(62) Division of application No. 15/404,469, filed on Jan. 12, 2017, now Pat. No. 9,935,014.

(51) Int. Cl.
*H01L 29/423* (2006.01)
*H01L 21/8234* (2006.01)
(Continued)

(52) U.S. Cl.
CPC ........... *H01L 29/42392* (2013.01); *H01L 21/823412* (2013.01); *H01L 21/823462* (2013.01); *H01L 21/845* (2013.01); *H01L 21/86* (2013.01); *H01L 27/1211* (2013.01); *H01L 29/0673* (2013.01); *H01L 21/3065* (2013.01); *H01L 21/30604* (2013.01)

(58) Field of Classification Search
CPC ............... H01L 27/0886; H01L 27/092; H01L 29/0673; H01L 29/42392
See application file for complete search history.

(56) References Cited

U.S. PATENT DOCUMENTS

2010/0295058 A1* 11/2010 Cho .................... B82Y 10/00
257/77
2014/0339611 A1* 11/2014 Leobandung ..... H01L 29/78609
257/288
(Continued)

OTHER PUBLICATIONS

List of IBM Patents or Patent Applications Treated as Related, U.S. Appl. No. 15/846,461, filed Dec. 19, 2017, 2 Pages.
(Continued)

*Primary Examiner* — Feifei Yeung Lopez
(74) *Attorney, Agent, or Firm* — Cantor Colburn LLP; Vazken Alexanian

(57) ABSTRACT

Embodiments are directed to a method and resulting structures for forming thin and thick gate dielectric nanosheet transistors on the same chip. A first nanosheet stack having a first sacrificial layer between a first nanosheet and a second nanosheet is formed on a substrate. A second nanosheet stack having a first sacrificial layer between a first nanosheet and a second nanosheet is formed on the substrate. The first nanosheet of the first nanosheet stack is doped and concurrently removed with the first sacrificial layer of the first nanosheet stack and the first sacrificial layer of the second nanosheet stack.

18 Claims, 12 Drawing Sheets

(51) Int. Cl.
  *H01L 21/84*     (2006.01)
  *H01L 27/12*     (2006.01)
  *H01L 29/06*     (2006.01)
  *H01L 21/86*     (2006.01)
  *H01L 21/306*    (2006.01)
  *H01L 21/3065*   (2006.01)

(56) References Cited

U.S. PATENT DOCUMENTS

2015/0372104 A1* 12/2015 Liu .................. H01L 29/42364
                                                         257/77
2016/0079394 A1*  3/2016 Li ................... H01L 29/66795
                                                         257/347
2017/0104060 A1*  4/2017 Balakrishnan ...... H01L 29/0673

OTHER PUBLICATIONS

Kangguo Cheng, et al. "Nanosheet Transistors Having Different Gate Dielectric Thicknesses on the Same Chip," U.S. Appl. No. 15/404,469, filed Jan. 12, 2017.

Kangguo Cheng, et al. "Nanosheet Transistors Having Different Gate Dielectric Thicknesses on the Same Chip," U.S. Appl. No. 15/846,447, filed Dec. 19, 2017.

Cheng et al., "Integrating Standard-Gate and Extended-Gate Nanosheet Transistors on the Same Substrate," U.S. Appl. No. 15/943,886, filed Apr. 3, 2018.

Cheng et al., "Integrating Thin and Thick Gate Dielectric Nanosheet Transistors on Same Chip," U.S. Appl. No. 15/815,009, filed Nov. 16, 2017.

List of IBM Patents or Patent Applications Treated as Related; Date Filed: Dec. 19, 2017, 2 pages.

\* cited by examiner

NANOSHEET TRANSISTORS HAVING DIFFERENT GATE DIELECTRIC THICKNESSES ON THE SAME CHIP

This application is a divisional of U.S. application Ser. No. 15/404,469, titled "NANOSHEET TRANSISTORS HAVING DIFFERENT GATE DIELECTRIC THICKNESSES ON THE SAME CHIP" filed Jan. 12, 2017, the contents of which are incorporated by reference herein in its entirety.

BACKGROUND

The present invention relates in general to semiconductor device fabrication methods and resulting structures. More specifically, the present invention relates to fabrication methods and resulting structures for integrating thin and thick gate dielectric nanosheet transistors on the same chip.

In contemporary semiconductor device fabrication processes a large number of semiconductor devices, such as field effect transistors (FETs), are fabricated on a single wafer. Some non-planar device architectures, such as nanosheet FETs, provide increased device density and some increased performance over lateral devices. In nanosheet FETs, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

According to one or more embodiments of the present invention, a method of forming nanosheet transistors having different gate dielectric thicknesses on the same chip is provided. A first nanosheet stack is formed on a substrate. The first nanosheet stack includes a first sacrificial layer between a first nanosheet and a second nanosheet. The method further includes forming a second nanosheet stack having a first sacrificial layer between a first nanosheet and a second nanosheet on the substrate. The method further includes doping the first nanosheet of the first nanosheet stack and concurrently removing the doped first nanosheet with the first sacrificial layer of the first nanosheet stack and the first sacrificial layer of the second nanosheet stack.

According to one or more embodiments of the present invention, a method of forming a thick gate dielectric nanosheet transistor is provided. A nanosheet stack is formed on a substrate. The nanosheet stack includes a first sacrificial layer formed between a first nanosheet and a second nanosheet. The method further includes doping a portion of the first nanosheet and concurrently removing the doped portion of the first nanosheet with the first sacrificial layer.

According to one or more embodiments of the present invention, a semiconductor device having thin and thick gate dielectric nanosheet transistors is provided. The structure includes a first nanosheet stack formed on a substrate. The first nanosheet stack includes a first nanosheet formed over a second nanosheet. The structure further includes a second nanosheet stack formed on the substrate. The second nanosheet stack includes a first nanosheet formed over a second nanosheet. A distance between adjacent nanosheets in the first nanosheet stack is greater than a distance between adjacent nanosheets in the second nanosheet stack. The structure further includes a dielectric layer formed over a channel region of the first nanosheet stack. The structure further includes a first gate formed over the dielectric layer in the channel region of the first nanosheet stack and a second gate formed over a channel region of the second nanosheet stack. The structure further includes a first gate contact on the first gate and a second gate contact on the second gate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
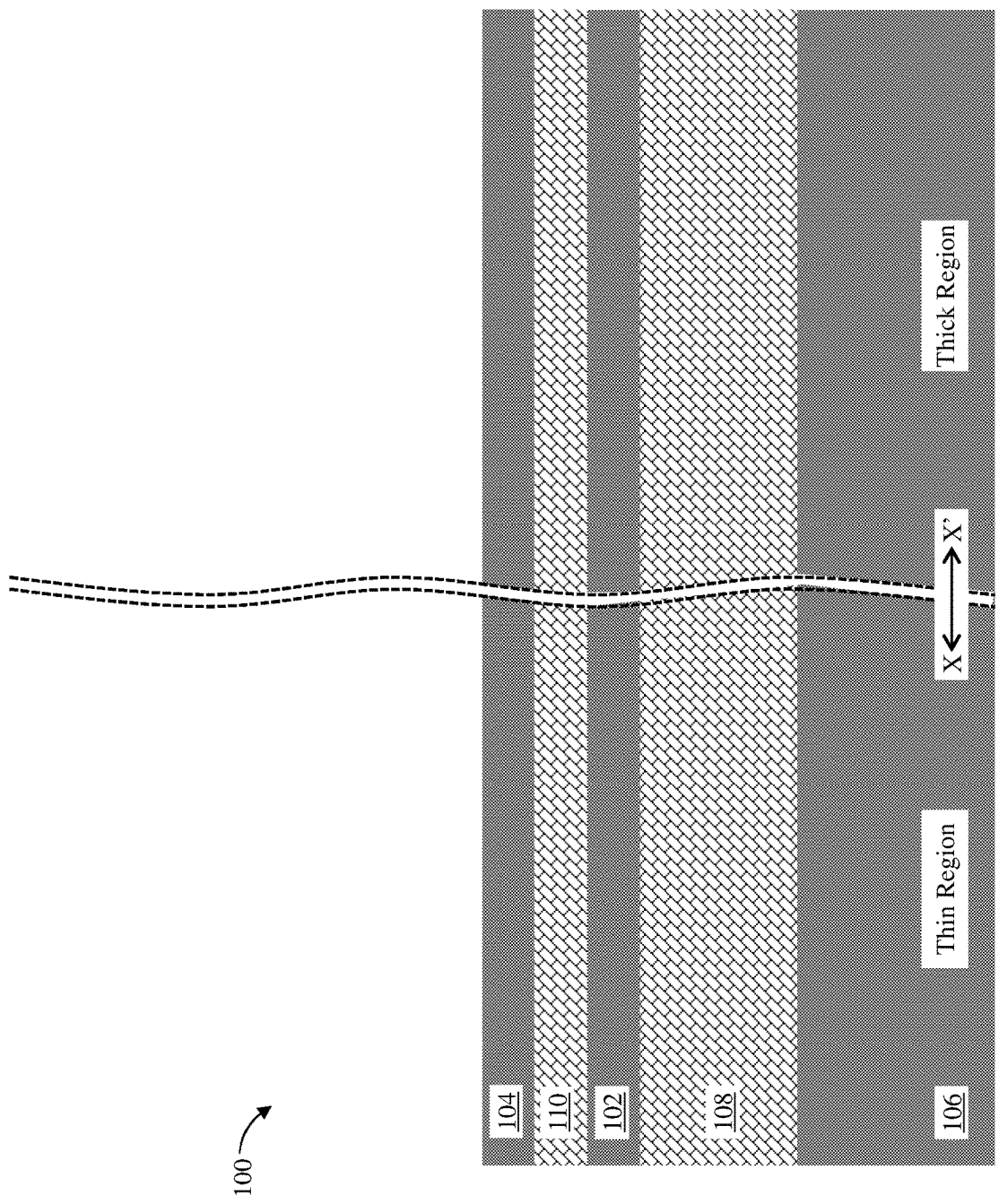
FIG. 1 depicts a cross-sectional view of a structure along a direction X-X' (across nanosheets direction) having semiconductor layers formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures, such as nanosheet FET devices, result in increased device density over lateral devices. There are challenges, however, in providing non-planar architectures for scaling beyond the 7 nm node. For example, processes for integrating transistors with thin and thick gate dielectrics on the same chip are needed to render stacked nanosheet architectures a viable technology. In conventional stacked nanosheet architectures the gap between adjacent nanosheets is kept small (typically no more than about 10 nm) to minimize parasitic capacitance between the gate and source/drain. These small nanosheet gaps are too narrow to accommodate a thick gate dielectric, gate work function, and gate metal. While thin gate dielectric transistors can be used for logic and SRAM, thick gate dielectric transistors are desired for high voltage applications such as, for example, I/O and analog circuitry. Thus, a method is desired for integrating nanosheet transistors having thin and thick gate dielectric thicknesses on the same chip.

Turning now to an overview of the aspects of the present invention, one or more embodiments provide methods of forming a thin gate dielectric FET and a thick gate dielectric FET on the same chip. A patterned block mask is formed over a portion of a nanosheet layer (defining, e.g., a thin gate region). The block mask protects the thin gate region while the exposed portion of the nanosheet layer (defining, e.g., a thick gate region) is doped. The doped portion of the nanosheet layer is removed after a sacrificial gate hard mask open step to form a large nanosheet gap (i.e., a nanosheet gap at least twice as large as a nanosheet gap in the thin gate region). A thick gate dielectric is formed in the thick nanosheet gap over a channel region of the thick gate dielectric FET. In this manner, a gate dielectric thickness of a first FET (i.e., a thick gate dielectric FET) can be greater than a gate dielectric thickness of a second FET (i.e., a thin gate dielectric FET).

Example methods for forming a thin gate dielectric FET and a thick gate dielectric FET on the same chip and the resulting structures therefrom in accordance with embodiments of the present invention are described in detail below by referring to the accompanying drawings in FIGS. 1-12.

Figure 4:
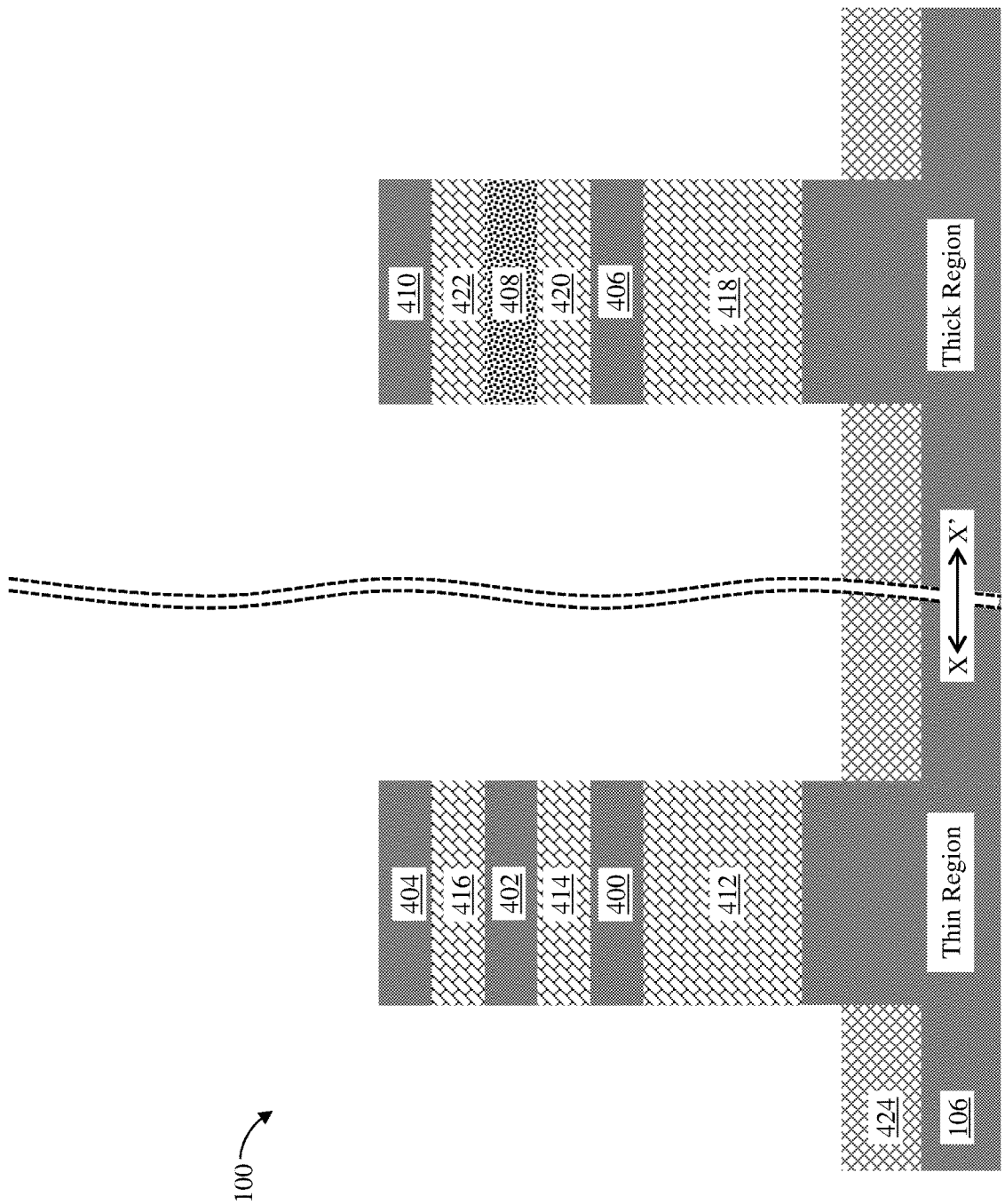
FIG. 4 depicts a cross-sectional view of the structure along the direction X-X' after patterning the semiconductor layers and the doped layer to form nanosheets in the Thin Region and nanosheets in a Thick Region of the substrate during an intermediate operation of a method of fabricating a semiconductor device according to one or more embodiments of the present invention.

FIG. 1 illustrates a cross-sectional view of a structure 100 along a direction X-X' (across nanosheets direction) having semiconductor layers 102 and 104 formed on a substrate 106 during an intermediate operation of a method of fabricating a semiconductor device according to one or more embodiments. In some embodiments, the semiconductor layers 102 and 104 alternate with sacrificial layers 108 and 110. In some embodiments, the semiconductor layers 102 and 104 and the sacrificial layers 108 and 110 are epitaxially grown films. For ease of discussion reference is made to operations performed on and to nanosheet stacks having three nanosheets (e.g., nanosheets 400, 402, and 404, as depicted in FIG. 4) alternating with three sacrificial layers (e.g., sacrificial layers 412, 414, and 416, as depicted in FIG. 4). It is understood, however, that the nanosheet stack can include any number of nanosheets alternating with a corresponding number of sacrificial layers. For example, the nanosheet stack can include a single nanosheet, two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets). In some embodiments, a topmost sacrificial layer is formed on a topmost nanosheet.

The semiconductor layers 102 and 104 can be made of any suitable material such as, for example, monocrystalline Si or silicon germanium (SiGe). In some embodiments, the semiconductor layers 102 and 104 are nFET nanosheets. In some embodiments, the nFET nanosheets are Si nFET nanosheets. In some embodiments, the semiconductor layers 102 and 104 have a thickness of about 4 nm to about 10 nm, although other thicknesses are within the contemplated scope of the invention. In yet other embodiments, the semiconductor layers 102 and 104 have a thickness of about 6 nm, although other thicknesses are within the contemplated scope of the invention.

The substrate 106 can be made of any suitable substrate material, such as, for example, monocrystalline Si, SiGe, SiC, III-V compound semiconductor, II-VI compound semiconductor, or semiconductor-on-insulator (SOI). In some embodiments, the substrate 106 includes a buried oxide layer (not depicted). In some embodiments, the substrate 106 includes both an nFET Region and a pFET Region. In some embodiments, the substrate 106 includes either an nFET Region or a pFET Region.

In some embodiments, the sacrificial layers 108 and 110 can be Si or SiGe. In embodiments where the semiconductor layers 102 and 104 are Si nFET nanosheets the sacrificial layers 108 and 110 are SiGe sacrificial layers. In some embodiments, the sacrificial layers 108 and 110 have a thickness of about 4 nm to about 15 nm, although other thicknesses are within the contemplated scope of the invention. In yet other embodiments, the sacrificial layers 108 and 110 have a thickness of about 10 nm.

Figure 2:
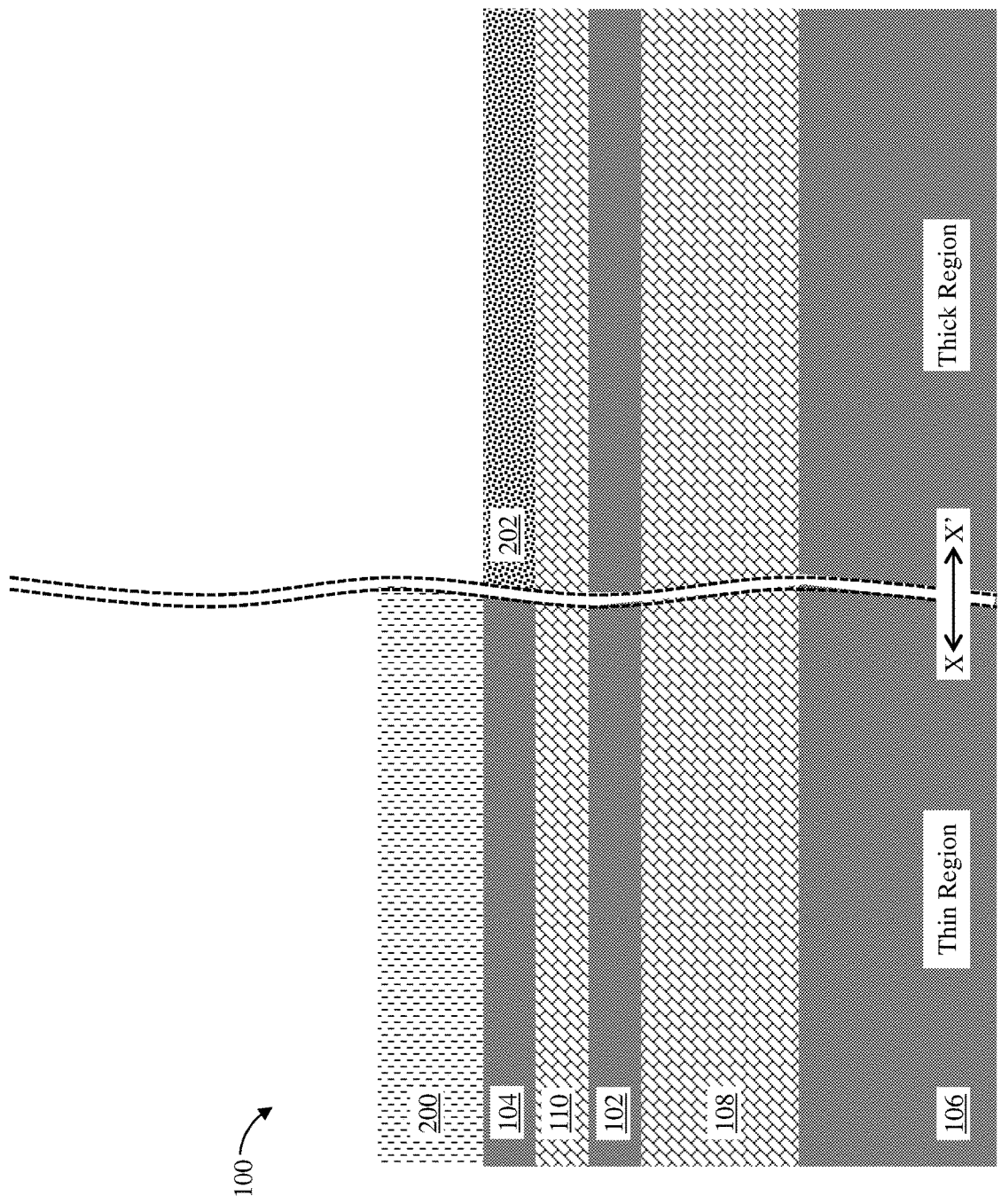
FIG. 2 depicts a cross-sectional view of the structure along the direction X-X' after forming a patterned block mask over a portion of the semiconductor layer within a Thin Region of the substrate during an intermediate operation of a method of fabricating a semiconductor device according to one or more embodiments of the present invention.
Figure 8:
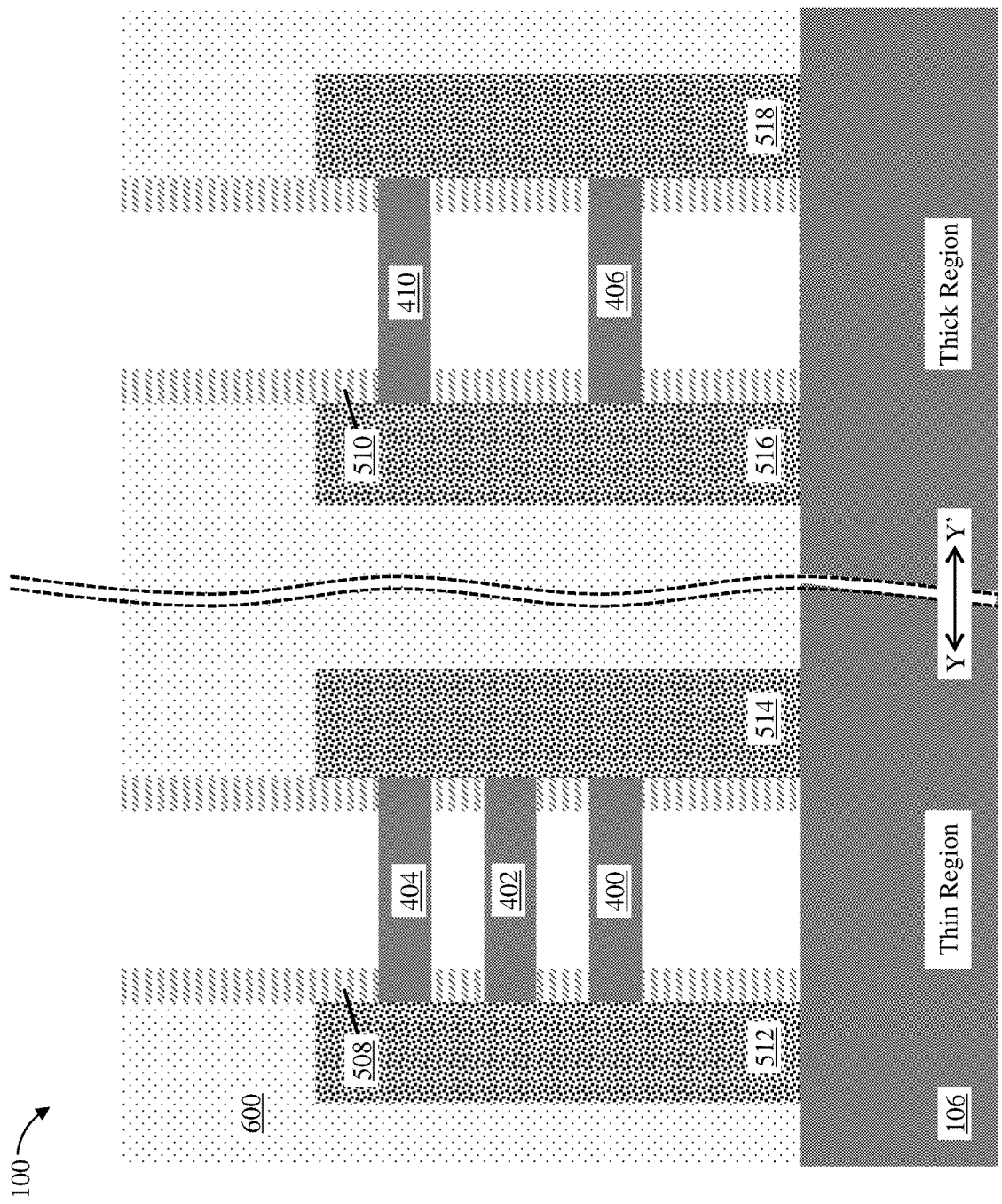
FIG. 8 depicts a cross-sectional view of the structure along the direction Y-Y' after removing the sacrificial layers and the doped nanosheet during an intermediate operation of a method of fabricating a semiconductor device according to one or more embodiments of the present invention.

FIG. 2 illustrates a cross-sectional view of the structure 100 along the direction X-X' after forming a patterned block mask 200 over a portion of the semiconductor layer 104 within a Thin Region of the substrate 106 during an intermediate operation of a method of fabricating a semiconductor device according to one or more embodiments. The block mask 200 can be made of any suitable material, such as, for example, a silicon nitride, silicon dioxide, a silicon oxynitride (SiON), a silicon carbide (SiC), a silicon oxygen carbonitride (SiOCN), or a silicoboron carbonitride (SiBCN). In some embodiments, the block mask 200 is a silicon nitride. In some embodiments, the block mask 200 has a thickness of about 10 nm to about 30 nm, although other thicknesses are within the contemplated scope of the invention. In some embodiments, the block mask 200 has a thickness of about 100 nm. After forming the block mask 200, uncovered portions of the semiconductor layer 104 (i.e., portions in the Thick Region) are doped to form a doped layer 202. The doped layer 202 can be formed using, for example, plasma doping at a temperature of about 400 degrees Celsius to about 700 degrees Celsius, diffusion, gas phase doping, solid phase doping, or hot ion implantation (e.g., implantation at high temperature of about 400 degrees Celsius to about 700 degrees Celsius). Dopants may include phosphorus (P) or arsenic (As). In some embodiments, the sacrificial layers 108 and 110 are SiGe layers, the semiconductor layers 102 and 104 are Si layers, and the doped layer 202 is formed using a germanium dopant. Doped layer 202 has an etch rate that is different from the undoped layers (e.g., semiconductor layers 102 and 104) and has a etch rate comparable with the sacrificial layers 108, 110 and 300. In this manner, the doped layer 202 can be removed concurrently with the sacrificial layers 108, 110, and 300 (as depicted in FIG. 8).

Figure 3:
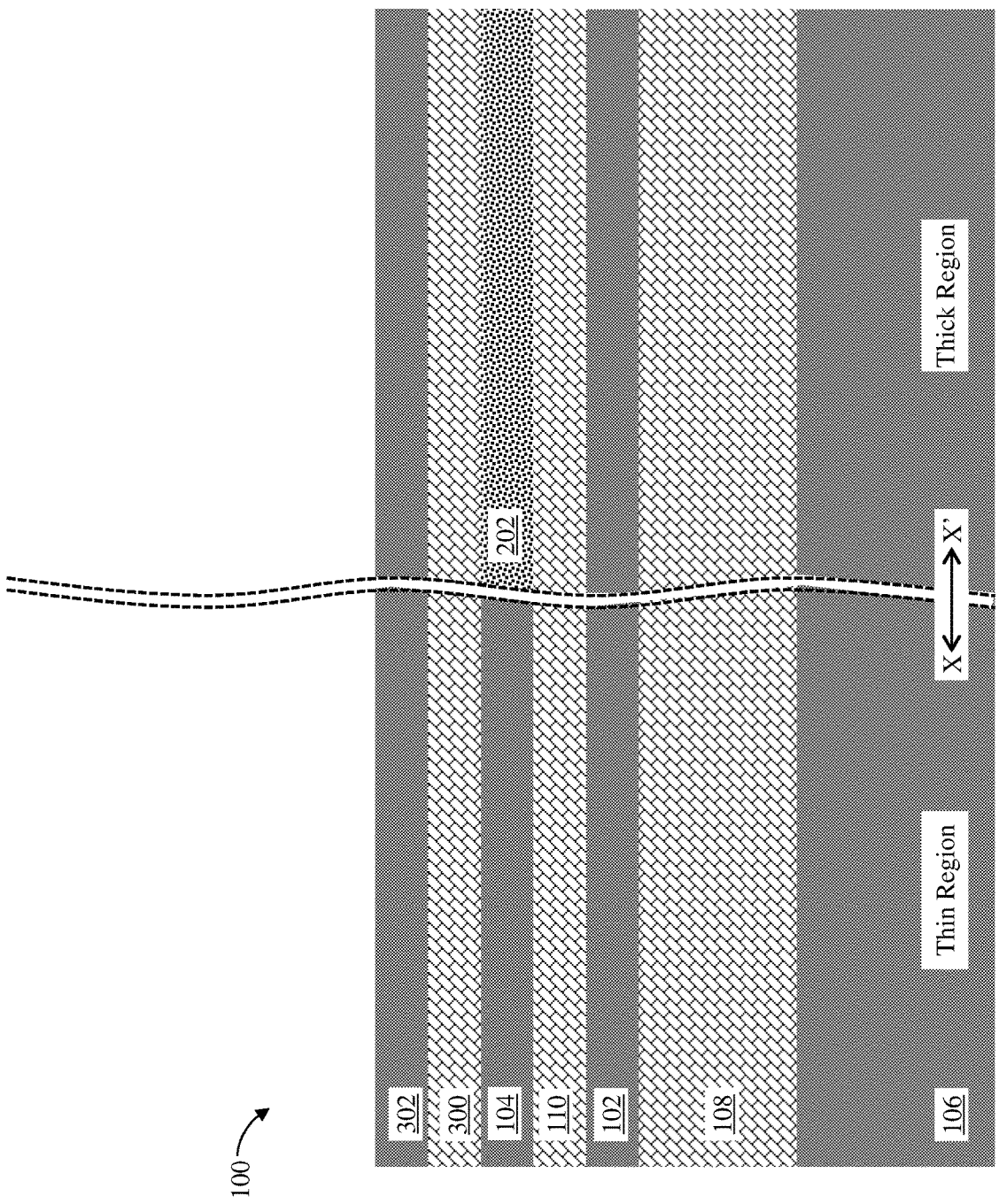
FIG. 3 depicts a cross-sectional view of the structure along the direction X-X' after removing the block mask and forming a sacrificial layer on a nanosheet and a doped layer during an intermediate operation of a method of fabricating a semiconductor device according to one or more embodiments of the present invention.

FIG. 3 illustrates a cross-sectional view of the structure 100 along the direction X-X' after removing the block mask 200 and forming a sacrificial layer 300 on the nanosheet 104 and the doped layer 202 during an intermediate operation of a method of fabricating a semiconductor device according to one or more embodiments. The sacrificial layer 300 can be formed in a similar manner as the sacrificial layers 108 and 110. A semiconductor layer 302 is formed on the sacrificial layer 300. The semiconductor layer 302 can be formed in a similar manner as the semiconductor layers 102 and 104.

FIG. 4 illustrates a cross-sectional view of the structure 100 along the direction X-X' after patterning the semiconductor layers 102, 104, and 302 and the doped layer 202 to form nanosheets 400, 402, and 404 in the Thin Region and nanosheets 406, 408 (i.e., a doped nanosheet), and 410 in the Thick Region during an intermediate operation of a method of fabricating a semiconductor device according to one or more embodiments. In this manner, the nanosheets 400, 402, and 404 define a first nanosheet stack and the nanosheets 406, 408, and 410 define a second nanosheet stack. Any known manner of patterning can be used, such as, for example, a sidewall image transfer (SIT) operation, a wet etch process, or a dry etch process. In some embodiments, the nanosheets 400, 402, 404, 406, 408, and 410 are patterned using a patterned hard mask and directional RIE. The sacrificial layers 108, 110, and 300 are similarly patterned to form sacrificial layers 412, 414, and 416 in the Thin Region and sacrificial layers 418, 420, and 422 in the Thick Region.

In some embodiments, portions of the substrate 106 are removed to expose a surface of the substrate 106 and a shallow trench isolation (STI) 424 is formed on the exposed surface. The STI 424 prevents electrical current leak between adjacent semiconductor device components. Any known composition and manner of forming the STI 424 can be utilized. The STI 424 can be made of any suitable material, such as, for example, a silicon oxide. In some embodiments, the STI 424 is etched via an etch back after a CMP process.

Figure 5:
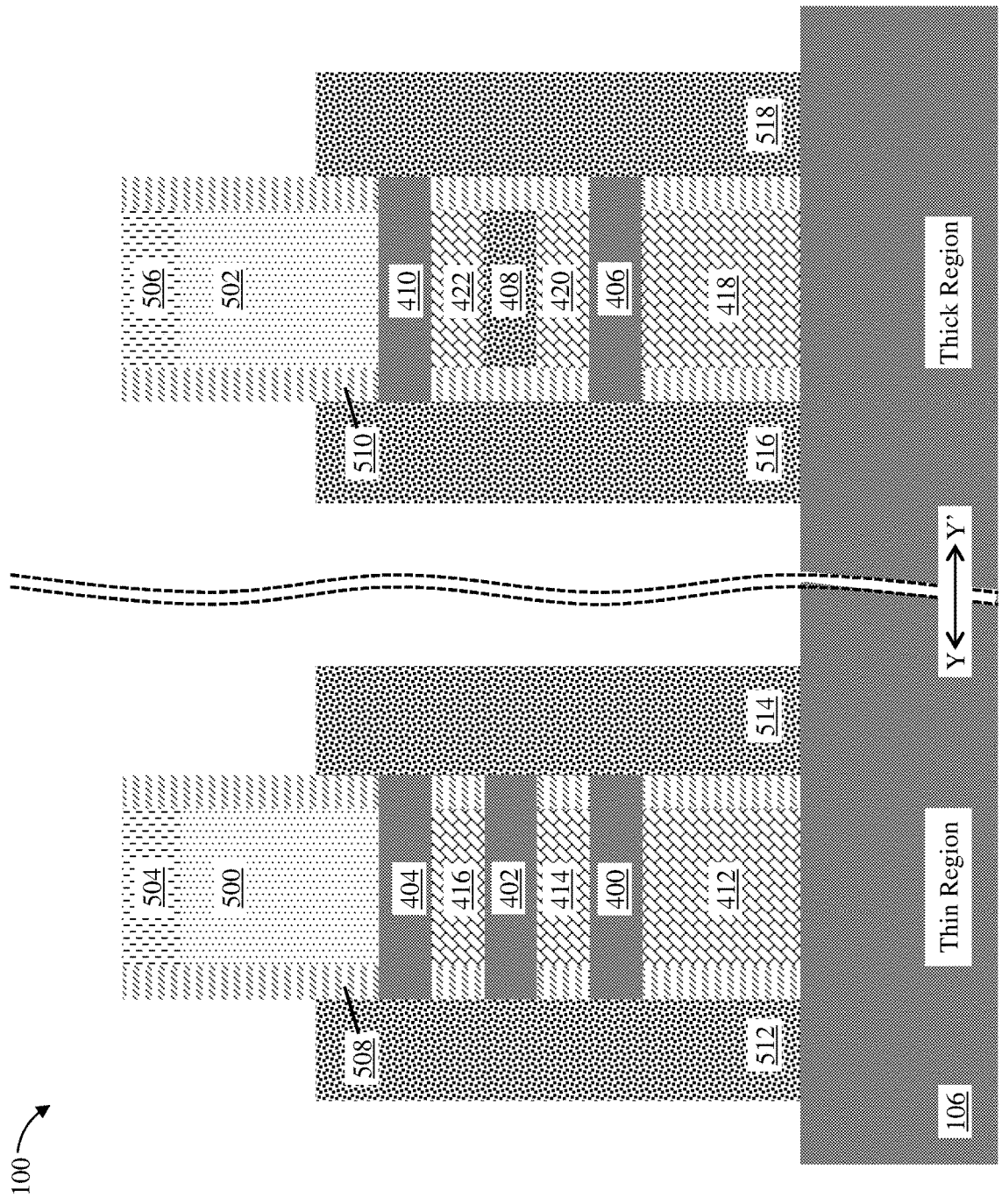
FIG. 5 depicts a cross-sectional view of the structure along a direction Y-Y' (across gate direction) after forming a first sacrificial gate over a channel region of a first nanosheet stack during an intermediate operation of a method of fabricating a semiconductor device according to one or more embodiments of the present invention.

FIG. 5 illustrates a cross-sectional view of the structure 100 along a direction Y-Y' (across gate direction) after forming a first sacrificial gate 500 over a channel region of the first nanosheet stack (i.e., nanosheets 400, 402, and 404) during an intermediate operation of a method of fabricating a semiconductor device according to one or more embodiments. The direction Y-Y' is perpendicular to the direction X-X'. A second sacrificial gate 502 is formed over a channel region of the second nanosheet stack (i.e., nanosheets 406, 408, and 410). The sacrificial gates 500 and 502 can be made of any suitable material, such as, for example, amorphous silicon or polysilicon. Any known method for patterning a sacrificial gate (also known as a dummy gate) can be used, such as, for example, a wet etch, a dry etch, or a combination of sequential wet and/or dry etches. In some embodiments, a hard mask 504 is formed on the first sacrificial gate 500 and a hard mask 506 is formed on the second sacrificial gate 502. In some embodiments, the first and second sacrificial gates 500 and 502 are formed by patterning the hard masks 504 and 506 and using a wet or dry etch process to selectively remove portions of the first and second sacrificial gates 500 and 502 which are not covered by the patterned hard masks 504 and 506. The hard masks 504 and 506 can be made of any suitable material, such as, for example, a silicon nitride. In some embodiments, second hard masks (not depicted) are formed on the hard masks 504 and 506, respectively, to form a bilayer hard mask. In some embodiments, the second hard masks include an oxide, such as, for example, silicon dioxide.

Spacers 508 and 510 (also known as sidewall spacers) are formed on sidewall surfaces of the first and second sacrificial gates 500 and 502, the sacrificial layers 412, 414, 416, 418, 420, and 422, and the doped nanosheet 408 during an intermediate operation of a method of fabricating a semiconductor device according to one or more embodiments. In some embodiments, the spacers 508 and 510 are formed using a CVD, PECVD, ALD, PVD, chemical solution deposition, or other like processes in combination with a wet or dry etch process. The spacers 508 and 510 can be made of any suitable material, such as, for example, a low-k dielectric, a nitride, silicon nitride, silicon dioxide, SiON, SiC, SiOCN, or SiBCN. In some embodiments, portions of the first nanosheet stack (i.e., nanosheets 400, 402, and 404) and portions of the second nanosheet stack (i.e., nanosheets 406, 408, and 410) are removed to expose a surface of the substrate 106. Any known method for patterning nanosheet stacks can be used, such as, for example, a wet etch, a dry etch, or a combination of sequential wet and/or dry etches. In some embodiments, a directional dry etch selective to the spacers 508 and 510 is used. In this manner, opposite ends of the first and second nanosheet stacks extend to opposite edges of the spacers 508 and 510, respectively.

Doped regions 512 and 514 are formed on opposite ends of the first nanosheet stack (e.g., nanosheets 400, 402, and 404) and doped regions 516 and 518 are formed on opposite ends of the second nanosheet stack (e.g., nanosheets 406, 408, and 410). The doped regions 512, 514, 516, and 518 can be source or drain regions formed in the substrate 106 by a variety of methods, such as, for example, in-situ doped epitaxy, doped following the epitaxy, or by implantation and plasma doping. In some embodiments, the doped regions 512 and 514, and the doped regions 516 and 518 are complementary, such that one of the doped regions is a source while the other is a drain. In embodiments having both nFET and pFET regions the doped regions 512 and 514 are n-type doped regions and the doped regions 516 and 518 are p-type doped regions. The doped regions 512, 514, 516, and 518 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), and MBE. In some embodiments, doped regions 512, 514, 516, and 518 include epitaxial semiconductor materials grown from gaseous or liquid precursors. In some embodiments, epitaxial regions are epitaxially grown over the substrate 106. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions 512, 514, 516, and 518 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^3$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 512, 514, 516, and 518 include silicon. In some embodiments, the doped regions 512, 514, 516, and 518 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 6:
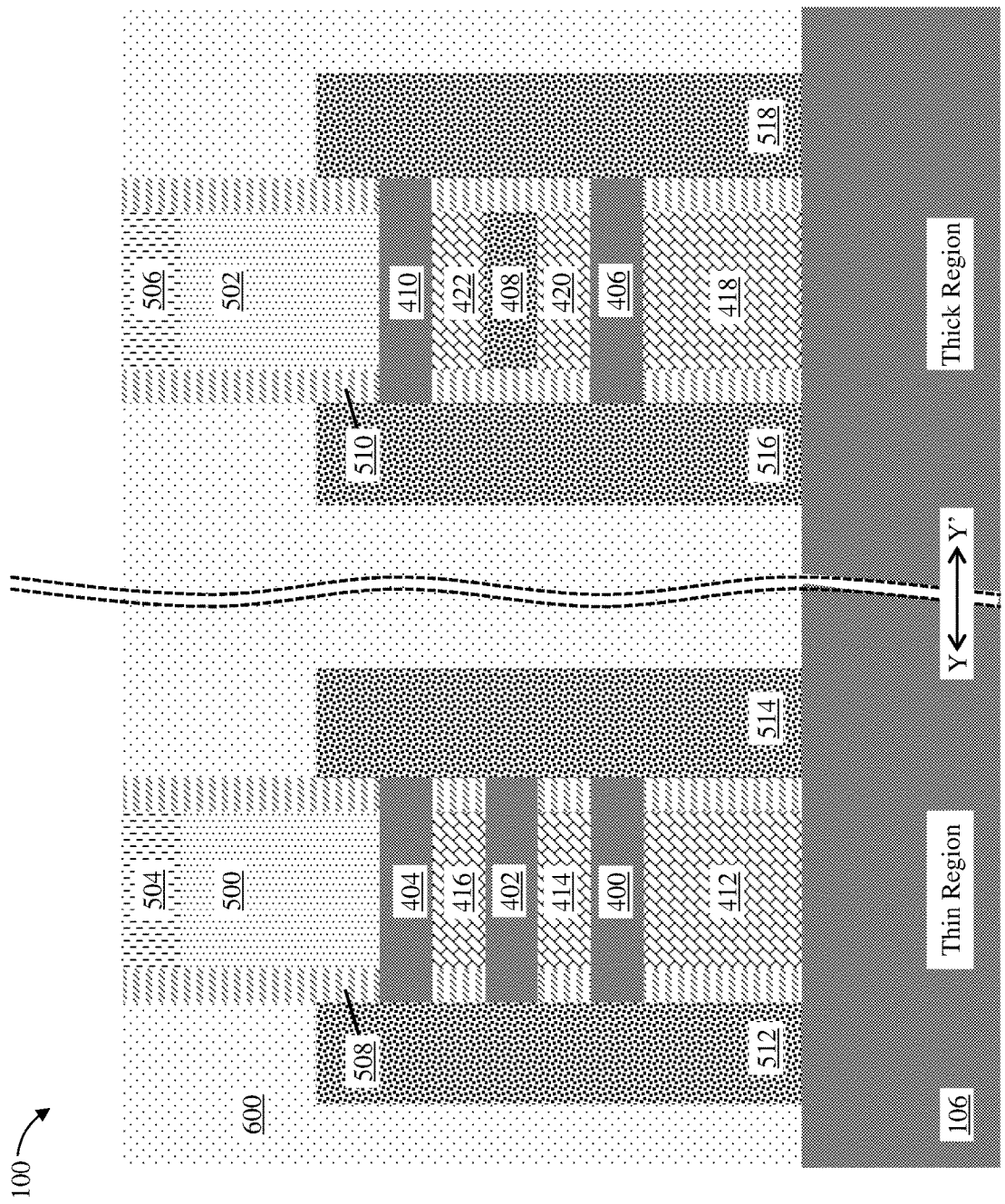
FIG. 6 depicts a cross-sectional view of the structure along the direction Y-Y' after forming an interlayer dielectric (ILD) over doped regions and the first and second sacrificial gates during an intermediate operation of a method of fabricating a semiconductor device according to one or more embodiments of the present invention.

FIG. 6 illustrates a cross-sectional view of the structure 100 along the direction Y-Y' after forming an interlayer dielectric (ILD) 600 over the doped regions 512, 514, 516, and 518 and the first and second sacrificial gates 500 and 502 during an intermediate operation of a method of fabricating a semiconductor device according to one or more embodiments. The ILD 600 can be made of any suitable material, such as, for example, porous silicates, carbon doped oxides, silicon dioxides, silicon nitrides, silicon oxynitrides, or other dielectric materials. Any known manner of forming the ILD 600 can be utilized. The ILD 600 can be formed using, for example, CVD, PECVD, ALD, flowable CVD, spin-on dielectrics, or PVD. In some embodiments, the ILD 600 is planarized to a top surface of the hard masks 504 and 506, using, for example, a CMP operation. In some embodiments, the ILD 600 includes a thin nitride cap layer (not depicted).

Figure 7:
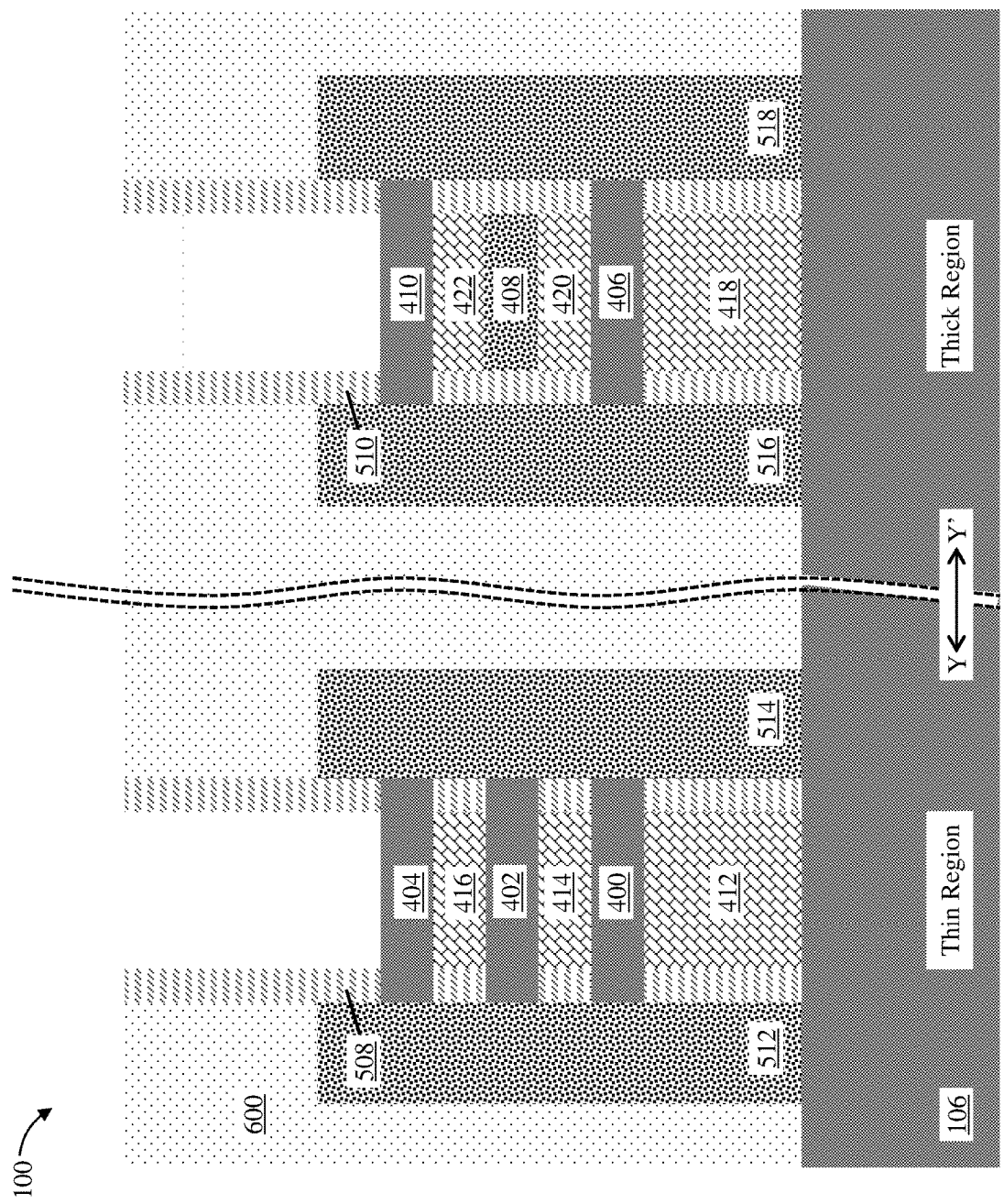
FIG. 7 depicts a cross-sectional view of the structure along the direction Y-Y' after opening the hard masks and removing the first and second sacrificial gates during an intermediate operation of a method of fabricating a semiconductor device according to one or more embodiments of the present invention.

FIG. 7 illustrates a cross-sectional view of the structure 100 along the direction Y-Y' after opening the hard masks 504 and 506 and removing the first and second sacrificial gates 500 and 502 during an intermediate operation of a method of fabricating a semiconductor device according to one or more embodiments. Any known method for removing the first and second sacrificial gates 500 and 502 can be used, such as, for example, a wet etch, a dry etch, or a combination of sequential wet and/or dry etches. In some embodiments, a directional dry etch selective to the spacers 508 and 510 is used.

FIG. 8 illustrates a cross-sectional view of the structure 100 along the direction Y-Y' after removing the sacrificial layers 412, 414, 416, 418, 420, and 422 and the doped nanosheet 408 during an intermediate operation of a method of fabricating a semiconductor device according to one or more embodiments. As previously described herein, the doped nanosheet 408 and the sacrificial layers 412, 414, 416, 418, 420, and 422 are removable using the same etchant (i.e., concurrently during the same wet or dry etch). Any suitable known removal process can be utilized. In some embodiments, the sacrificial layers 412, 414, 416, 418, 420, and 422 and the doped nanosheet 408 are removed using a wet or dry etch process selective to the nanosheets 400, 402, 404, 406, and 410. In some embodiments, an HCl etch is used to remove the sacrificial layers 412, 414, 416, 418, 420, and 422 and the doped nanosheet 408. In some embodiments, the HCl etch is a highly SiGe selective vapor phase etch at a temperature of about 300 to about 700 degrees Celsius. In some embodiments, tetramethylammnoium hydroxide (TMAH), tetraethylammnoium hydroxide (TEAH), or ammonium hydroxide (NH$_4$OH) can be used to selectively remove the sacrificial layers 412, 414, 416, 418, 420, and 422 and the doped nanosheet 408. In this manner, a distance between adjacent nanosheets in the Thick Region (e.g., a distance between nanosheets 406 and 410) is greater than a distance between adjacent nanosheets in the Thin Region (e.g., a distance between nanosheets 400 and 402 or between nanosheets 402 and 404). In some embodiments, the distance between adjacent nanosheets in the Thick Region is greater than about 10 nm. In this manner, the distance (or gap) between adjacent nanosheets in the Thick Region is large enough to accommodate a thick gate dielectric as well as a gate metal (as depicted in FIG. 11).

Figure 9:
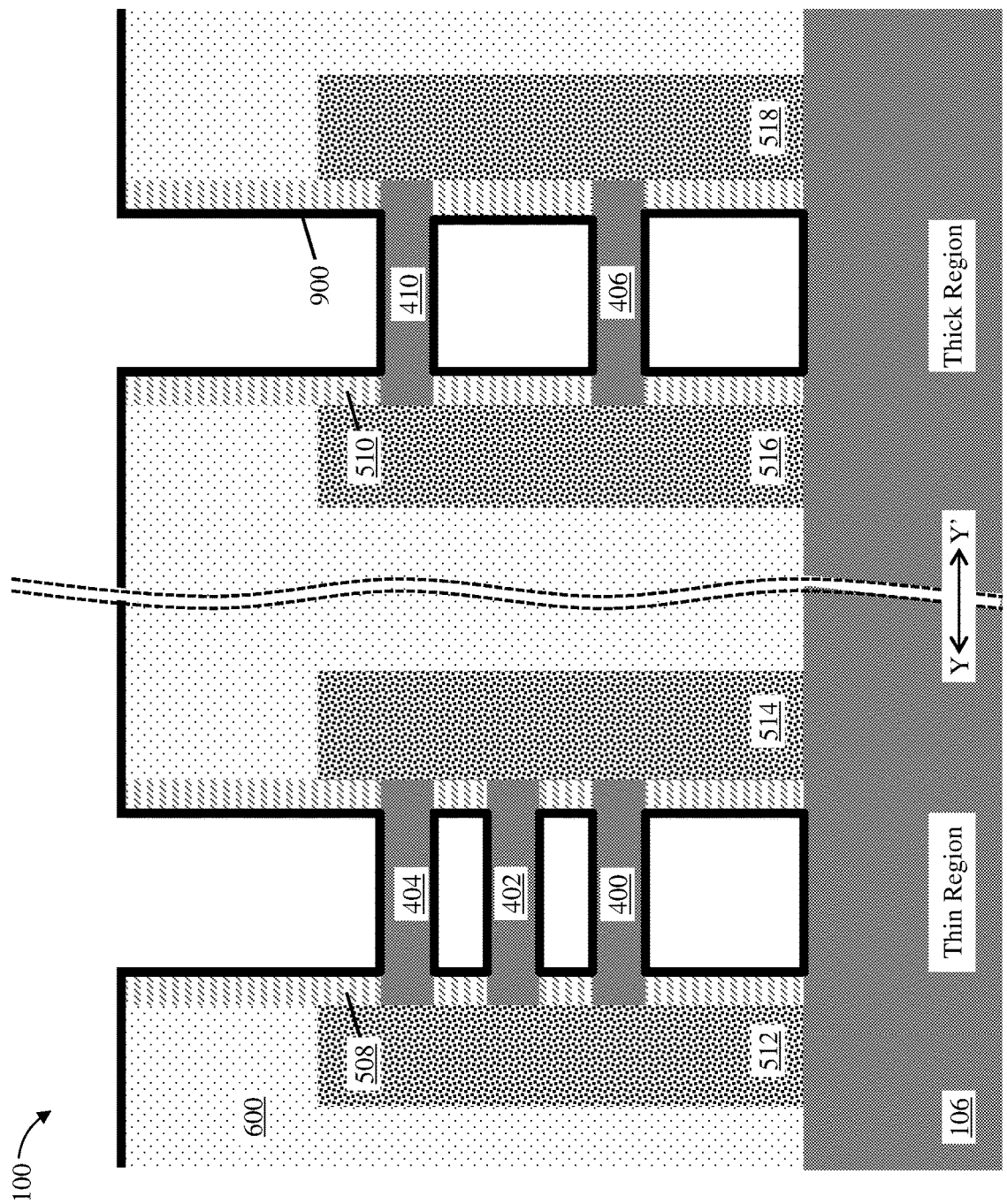
FIG. 9 depicts a cross-sectional view of the structure along the direction Y-Y' after forming a thick dielectric layer over channel regions of the first and second nanosheet stacks during an intermediate operation of a method of fabricating a semiconductor device according to one or more embodiments of the present invention.

FIG. 9 illustrates a cross-sectional view of the structure 100 along the direction Y-Y' after forming a thick dielectric layer 900 over channel regions of the first nanosheet stack (i.e., the nanosheets 400, 402, and 404) and the second nanosheet stack (i.e., the nanosheets 406 and 410) during an intermediate operation of a method of fabricating a semiconductor device according to one or more embodiments. The thick dielectric layer 900 can be formed using, for example, CVD, PECVD, ALD, flowable CVD, spin-on dielectrics, or PVD. In some embodiments, the thick dielectric layer 900 is conformally formed using ALD to a thickness of about 3 nm to about 10 nm, although other thicknesses are within the contemplated scope of the invention.

Figure 10:
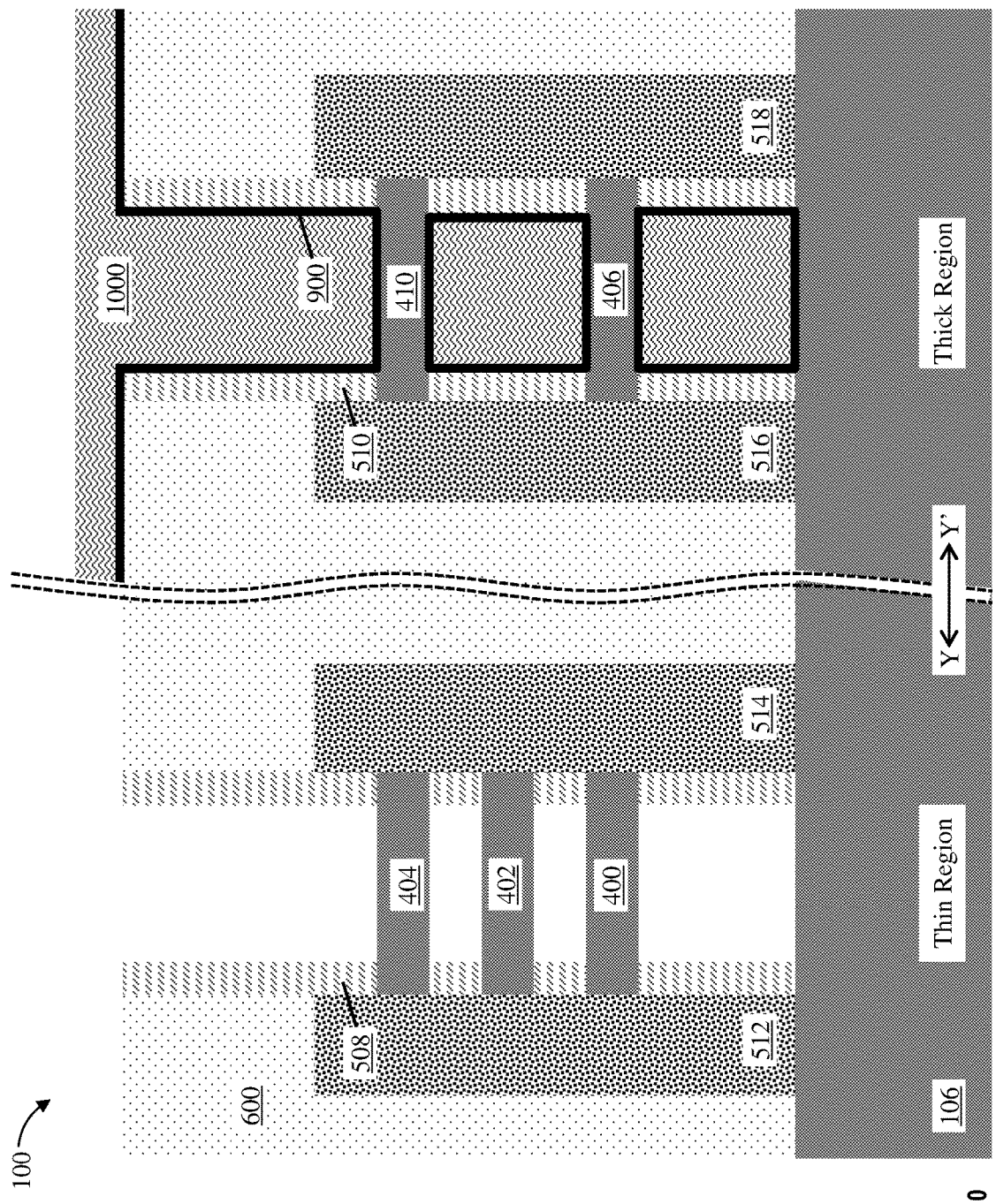
FIG. 10 depicts a cross-sectional view of the structure along the direction Y-Y' after forming a patterned block mask to cover the thick dielectric layer in the Thick Region during an intermediate operation of a method of fabricating a semiconductor device according to one or more embodiments of the present invention.

FIG. 10 illustrates a cross-sectional view of the structure 100 along the direction Y-Y' after forming a patterned block mask 1000 to cover the thick dielectric layer 900 in the Thick Region during an intermediate operation of a method of fabricating a semiconductor device according to one or more embodiments. The block mask 1000 can be made of any suitable material, such as, for example, a silicon nitride, silicon dioxide, a silicon oxynitride (SiON), a silicon carbide (SiC), a silicon oxygen carbonitride (SiOCN), or a silicoboron carbonitride (SiBCN). In some embodiments, the block mask 1000 is a silicon nitride. In some embodiments, the block mask 1000 has a thickness of about 10 nm to about 30 nm, although other thicknesses are within the contemplated scope of the invention. In some embodiments, the block mask 1000 has a thickness of about 100 nm. The portion of the thick dielectric layer 900 in the Thin Region is removed after forming the block mask 1000. Any suitable known removal process can be utilized. In some embodiments, the portion of the thick dielectric layer 900 in the Thin Region is removed using a wet or dry etch process selective to the spacer 508 and the nanosheets 400, 402, and 404. In this manner, a gate dielectric thickness of a first FET (i.e., a thick gate dielectric FET in the Thick Region) can be greater than a gate dielectric thickness of a second FET (i.e., a thin gate dielectric FET in the Thin Region).

Figure 11:
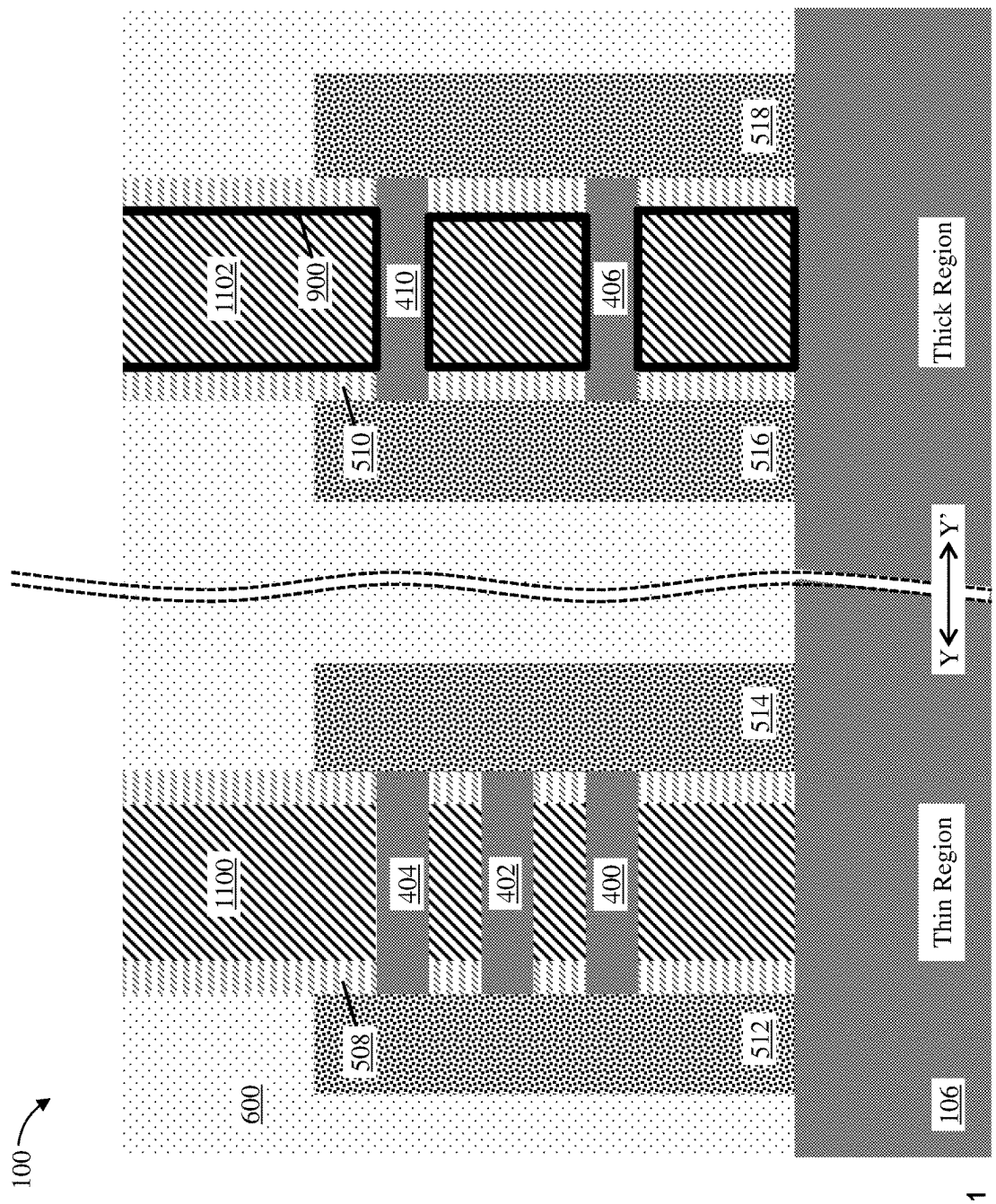
FIG. 11 depicts a cross-sectional view of the structure along the direction Y-Y' after removing the block mask and forming conductive gates to wrap around channel regions of the first and second nanosheet stacks during an intermediate operation of a method of fabricating a semiconductor device according to one or more embodiments of the present invention.

FIG. 11 illustrates a cross-sectional view of the structure 100 along the direction Y-Y' after removing the block mask 1000 and forming conductive gates 1100 and 1102 to wrap around channel regions of the first and second nanosheet stacks, respectively, during an intermediate operation of a method of fabricating a semiconductor device according to one or more embodiments. The conductive gates 1100 and 1102 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the conductive gates 1100 and 1102 are planarized to a top surface of the spacers 508 and 510, using, for example, a CMP operation.

In some embodiments, a high-k dielectric (not depicted) is formed between each of the conductive gates 1100 and 1102 and the channel regions of the first and second nanosheet stacks, respectively. In some embodiments, the high-k dielectric modifies the work function of each respective gate. The high-k dielectrics can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectrics can have a thickness of about 0.5 nm to about 4 nm. In some embodiments, the high-k dielectrics can have a thickness of about 2 nm to about 3 nm, although other thicknesses are within the contemplated scope of the invention.

In some embodiments, work function layers (not depicted) are formed between each of the high-k dielectrics and the conductive gates 1100 and 1102, respectively. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of each respective gate.

Figure 12:
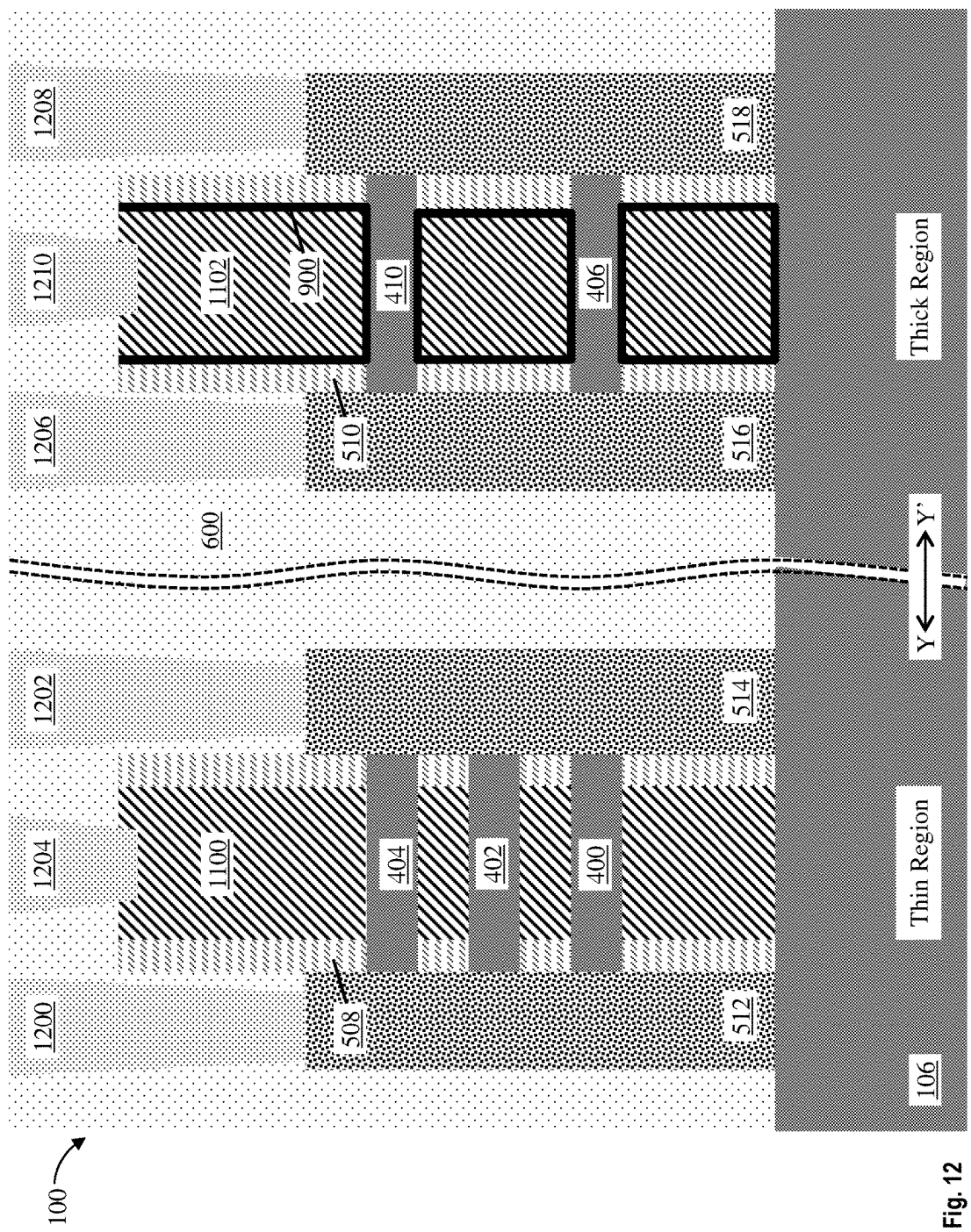
FIG. 12 depicts a cross-sectional view of the structure along the direction Y-Y' after expanding the interlayer dielectric (ILD) above a surface of the conductive gates and forming contacts in the ILD during an intermediate operation of a method of fabricating a semiconductor device according to one or more embodiments of the present invention.

FIG. 12 illustrates a cross-sectional view of the structure 100 along the direction Y-Y' after expanding the ILD 600 above a surface of the conductive gates 1100 and 1102 and forming contacts 1200, 1202, 1204, 1206, 1208, and 1210 in the ILD 600 during an intermediate operation of a method of fabricating a semiconductor device according to one or more embodiment. The contacts 1200, 1202, 1204, 1206, 1208, and 1210 can be formed using known metallization techniques. In some embodiments, the ILD 600 is extended with additional material, patterned with open trenches, and the contacts 1200, 1202, 1204, 1206, 1208, and 1210 are deposited into the trenches. In some embodiments, the contacts 1200, 1202, 1204, 1206, 1208, and 1210 are overfilled into the trenches, forming overburdens above a surface of the ILD 600. In some embodiments, a CMP selective to the ILD 600 removes the overburden.

The contacts 1200, 1202, 1204, 1206, 1208, and 1210 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts 1200, 1202, 1204, 1206, 1208, and 1210 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
a first nanosheet stack on a substrate, the first nanosheet stack comprising a first nanosheet formed over a second nanosheet;
a second nanosheet stack on the substrate, the second nanosheet stack comprising a first nanosheet formed over a second nanosheet;
a dielectric layer formed over a channel region of the first nanosheet stack;
a first gate formed over the dielectric layer in the channel region of the first nanosheet stack;
a second gate formed over a channel region of the second nanosheet stack;
a first gate contact on the first gate; and
a second gate contact on the second gate;
wherein a distance between adjacent nanosheets in the first nanosheet stack is greater than a distance between adjacent nanosheets in the second nanosheet stack;
wherein spacers are formed between the adjacent nanosheets in the first nanosheet stack and between adjacent nanosheets in the second nanosheet stack;
wherein a length of the spacers between the adjacent nanosheets in the first nanosheet stack is greater than a length of at least one of the spacers between the adjacent nanosheets in the second nanosheet stack;
wherein the first gate comprises a high-k dielectric film formed on a surface of the dielectric layer in the channel region of the first nanosheet stack; and
wherein the length of a bottom most spacer of the spacers below the adjacent nanosheets in the first nanosheet stack is greater than the length of the at least one of the spacers between the adjacent nanosheets in the second nanosheet stack.

2. The semiconductor device of claim 1, wherein a distance between the adjacent nanosheets in the first nanosheet stack is at least double a distance between the adjacent nanosheets in the second nanosheet stack.

3. The semiconductor device of claim 1, wherein each nanosheet of the first and second nanosheet stacks is a silicon nanosheet.

4. The semiconductor device of claim 1, wherein each nanosheet of the first and second nanosheet stacks comprises a thickness of about 4 nm to about 10 nm.

5. The semiconductor device of claim 1, wherein a distance between adjacent nanosheets in the first nanosheet stack is greater than about 10 nm.

6. The semiconductor device of claim 1, wherein the dielectric layer comprises a thickness of about 3 nm to about 10 nm.

7. The semiconductor device of claim 1 further comprising first source or drain regions formed adjacent to opposite sidewalls of the first nanosheet stack.

8. The semiconductor device of claim 7 further comprising second source or drain regions formed adjacent to opposite sidewalls of the second nanosheet stack, the first and second source or drain regions separated by an interlayer dielectric.

9. The semiconductor device of claim 1, wherein the second gate comprises a high-k dielectric film formed on a surface of the first and second nanosheets in the channel region of the second nanosheet stack.

10. A semiconductor device comprising:
a first nanosheet field effect transistor (FET) comprising two or more vertically stacked nanosheets on a substrate;
a second nanosheet FET comprising two or more vertically stacked nanosheets on the substrate, the second nanosheet FET adjacent to the first nanosheet FET;
a thick gate dielectric layer formed over a channel region of the first nanosheet FET;
a first gate formed over the thick gate dielectric layer in the channel region of the first nanosheet FET; and
a second gate formed over a channel region of the second nanosheet FET;
wherein the thick gate dielectric layer is between the first gate and each of the two or more vertically stacked nanosheets of the first nanosheet FET;
wherein spacers are formed between the adjacent nanosheets in the first nanosheet stack and between adjacent nanosheets in the second nanosheet stack;
wherein a length of the spacers between the adjacent nanosheets in the first nanosheet stack is greater than a length of at least one of the spacers between the adjacent nanosheets in the second nanosheet stack;
wherein the first gate comprises a high-k dielectric film formed on a surface of the thick gate dielectric layer in the channel region of the first nanosheet FET; and
wherein the length of a bottom most spacer of the spacers below the adjacent nanosheets in the first nanosheet stack is greater than the length of the at least one of the spacers between the adjacent nanosheets in the second nanosheet stack.

11. The semiconductor device of claim 10, wherein a distance between nanosheets in the first nanosheet FET is at least double a distance between nanosheets in the second nanosheet FET.

12. The semiconductor device of claim 10, wherein each nanosheet of the first and second nanosheet FETs is a silicon nanosheet.

13. The semiconductor device of claim 10, wherein each nanosheet of the first and second nanosheet FETs comprises a thickness of about 4 nm to about 10 nm.

14. The semiconductor device of claim 10, wherein a distance between nanosheets in the first nanosheet stack is greater than about 10 nm.

15. The semiconductor device of claim 10, wherein the thick gate dielectric layer comprises a thickness of about 3 nm to about 10 nm.

16. The semiconductor device of claim 10 further comprising first source or drain regions formed adjacent to opposite sidewalls of the first nanosheet FET.

17. The semiconductor device of claim 16 further comprising second source or drain regions formed adjacent to opposite sidewalls of the second nanosheet FET, the first and second source or drain regions separated by an interlayer dielectric.

18. The semiconductor device of claim 10, wherein the second gate comprises a high-k dielectric film formed on a surface of the first and second nanosheets in the channel region of the second nanosheet FET.

* * * * *